(12) United States Patent
McEvoy et al.

(10) Patent No.: US 10,384,978 B2
(45) Date of Patent: Aug. 20, 2019

(54) THERMAL BARRIER COATING REPAIR COMPOSITIONS AND METHODS OF USE THEREOF

(71) Applicant: GENERAL ELECTRIC COMPANY, Schenectady, NY (US)

(72) Inventors: Kevin Paul McEvoy, Fairborn, OH (US); James Ruud, Delmar, NY (US); Lawrence E. Szala, Scotia, NY (US); Susan Corah, Glenville, NY (US); Atanu Saha, Bangalore (IN); Hrishikesh Keshavan, Watervliet, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 65 days.

(21) Appl. No.: 15/243,005

(22) Filed: Aug. 22, 2016

(65) Prior Publication Data
US 2018/0050964 A1    Feb. 22, 2018

(51) Int. Cl.
*C04B 35/48* (2006.01)
*F01D 5/28* (2006.01)
(Continued)

(52) U.S. Cl.
CPC ........ *C04B 35/48* (2013.01); *C04B 35/62222* (2013.01); *C04B 35/64* (2013.01);
(Continued)

(58) Field of Classification Search
CPC ... C04B 35/48; C04B 35/62222; C04B 35/64; C04B 41/009; C04B 41/5042;
(Continued)

(56) References Cited

U.S. PATENT DOCUMENTS

| 4,649,858 A | 3/1987 | Sakai et al. |
| 5,644,394 A | 7/1997 | Owens |

(Continued)

FOREIGN PATENT DOCUMENTS

| EP | 1172460 A2 | 1/2002 |
| EP | 1 783 247 A2 | 5/2007 |

(Continued)

OTHER PUBLICATIONS

Bhatia, T., et al., "Environmental Barrier Coatings for Monolithic Silicon Nitride Bond Coat Development," Proceedings of GT2007 ASME Turbo Expo, vol. 1, pp. 1-8 (May 14-17, 2007).

(Continued)

*Primary Examiner* — Kirsten Jolley
(74) *Attorney, Agent, or Firm* — Christopher R. Carroll; The Small Patent Law Group LLC (57) ABSTRACT

The present invention is directed to repair compositions for thermal barrier coatings and methods of use thereof. The repair compositions include a ceramic composition, a colloidal solution, an aqueous binder, an aqueous dispersant, and an aqueous ammonia solution. The ceramic composition includes a first population of yttria-stabilized zirconia particles having a mean diameter from about 250 nm to about 1000 nm, a second population of yttria-stabilized zirconia particles having a mean diameter from about 2 μm to about 10 μm, and a third population of yttria-stabilized zirconia particles having a mean diameter from about 20 μm to about 250 μm. One method includes depositing the repair layer onto the damaged region, the repair layer including the repair composition, and heat treating the repair layer.

40 Claims, 1 Drawing Sheet

(51) Int. Cl.
  *C23C 4/134*     (2016.01)
  *C04B 35/622*    (2006.01)
  *C04B 35/64*     (2006.01)
  *C23C 14/22*     (2006.01)
  *C04B 41/87*     (2006.01)
  *C04B 41/00*     (2006.01)
  *C04B 41/50*     (2006.01)
  *C23C 28/00*     (2006.01)
  *F01D 5/00*      (2006.01)
  *C23C 4/11*      (2016.01)

(52) U.S. Cl.
  CPC ........ *C04B 41/009* (2013.01); *C04B 41/5042* (2013.01); *C04B 41/87* (2013.01); *C23C 4/11* (2016.01); *C23C 4/134* (2016.01); *C23C 14/221* (2013.01); *C23C 28/3455* (2013.01); *F01D 5/005* (2013.01); *F01D 5/288* (2013.01); *C04B 2235/5436* (2013.01); *C04B 2235/5445* (2013.01); *C04B 2235/9607* (2013.01); *F05B 2230/80* (2013.01); *F05B 2230/90* (2013.01); *F05C 2203/0895* (2013.01); *F05D 2300/2118* (2013.01); *Y02T 50/6765* (2018.05)

(58) Field of Classification Search
  CPC ............ C04B 41/87; C04B 2235/5445; C04B 2235/5436; C23C 4/11; C23C 4/134; C23C 14/221; C23C 18/06; C23C 18/1216; C23C 28/3455; F01D 5/005; F01D 5/288; F05B 2230/80; F05B 2230/90; F05C 2203/0895
  USPC ........................................................ 427/140
  See application file for complete search history.

(56) References Cited

U.S. PATENT DOCUMENTS

| | | | |
|---|---|---|---|
| 5,723,078 A | 3/1998 | Nagaraj et al. | |
| 5,759,932 A | 6/1998 | Sangeeta et al. | |
| 5,817,372 A * | 10/1998 | Zheng | C23C 4/02 427/456 |
| 5,902,647 A | 5/1999 | Venkataramani et al. | |
| 5,985,368 A | 11/1999 | Sangeeta et al. | |
| 6,042,880 A | 3/2000 | Rigney et al. | |
| 6,074,706 A | 6/2000 | Beverley et al. | |
| 6,235,352 B1 | 5/2001 | Leverant et al. | |
| 6,335,078 B2 | 1/2002 | Venkataramani et al. | |
| 6,378,159 B1 | 4/2002 | Garrison et al. | |
| 6,413,578 B1 | 7/2002 | Stowell et al. | |
| 6,497,758 B1 | 12/2002 | Hasz et al. | |
| 6,605,160 B2 | 8/2003 | Hoskin | |
| 6,827,969 B1 | 12/2004 | Skoog et al. | |
| 6,875,464 B2 | 4/2005 | Ruud et al. | |
| 6,881,439 B2 | 4/2005 | Graham et al. | |
| 6,890,587 B2 | 5/2005 | Khan et al. | |
| 6,919,121 B2 | 7/2005 | Stowell et al. | |
| 7,008,522 B2 | 3/2006 | Boucard et al. | |
| 7,029,721 B2 | 4/2006 | Hasz et al. | |
| 7,041,370 B1 | 5/2006 | Clough | |
| 7,093,993 B2 | 8/2006 | Skoog et al. | |
| 7,163,718 B2 | 1/2007 | Das et al. | |
| 7,422,671 B2 | 9/2008 | Bhatia et al. | |
| 7,476,703 B2 | 1/2009 | Ruud et al. | |
| 7,509,735 B2 | 3/2009 | Philip et al. | |
| 7,538,045 B2 | 5/2009 | Bhatia et al. | |
| 7,588,797 B2 | 9/2009 | Skoog et al. | |
| 7,611,781 B1 | 11/2009 | Kokubo et al. | |
| 7,829,196 B2 | 11/2010 | Kokubo et al. | |
| 7,842,335 B2 | 11/2010 | Skoog et al. | |
| 8,221,825 B2 | 7/2012 | Reitz et al. | |
| 8,400,501 B2 | 3/2013 | Heyworth et al. | |
| 8,563,080 B2 | 10/2013 | Hopkins | |
| 8,597,724 B2 | 12/2013 | Bunting et al. | |
| 9,085,053 B2 | 7/2015 | Tholen et al. | |
| 2003/0024430 A1 | 2/2003 | Hasz et al. | |
| 2003/0101587 A1 | 6/2003 | Rigney et al. | |
| 2004/0180232 A1 | 9/2004 | Das et al. | |
| 2005/0129868 A1 | 6/2005 | Philip et al. | |
| 2007/0202269 A1 | 8/2007 | Potter et al. | |
| 2009/0044896 A1 * | 2/2009 | Adam | B32B 18/00 156/94 |
| 2009/0074576 A1 | 3/2009 | Brostmeyer | |
| 2009/0274850 A1 | 11/2009 | Bhatia et al. | |
| 2009/0297701 A1 | 12/2009 | Jabado et al. | |
| 2009/0297718 A1 | 12/2009 | Sarrafi-Nour et al. | |
| 2010/0237134 A1 | 9/2010 | Bucci et al. | |
| 2010/0247323 A1 * | 9/2010 | Persky | C23C 28/04 416/241 R |
| 2011/0058975 A1 | 3/2011 | Bampton | |
| 2011/0206533 A1 | 8/2011 | Lee et al. | |
| 2011/0244138 A1 | 10/2011 | Schlichting et al. | |
| 2014/0259589 A1 | 9/2014 | Ku et al. | |
| 2014/0315029 A1 | 10/2014 | Roberts, III et al. | |
| 2015/0132605 A1 * | 5/2015 | Kumar | C04B 35/117 428/680 |
| 2015/0174837 A1 | 6/2015 | Kolvick et al. | |
| 2015/0175486 A1 | 6/2015 | Roberts et al. | |

FOREIGN PATENT DOCUMENTS

| | | |
|---|---|---|
| EP | 3 040 387 A1 | 7/2016 |
| WO | 2015073196 A1 | 5/2015 |
| WO | 2015082818 A1 | 6/2015 |

OTHER PUBLICATIONS

Maricocchi, A., et al., "PVD TBC Experience on GE Aircraft Engines," Journal of Thermal Spray Technology, vol. 3, Issue 2, pp. 193-198 (Jun. 1997).

International Search Report and Written Opinion issued in connection with corresponding PCT Application No. PCT/US2017/047127 dated Nov. 21, 2017.

K.J. Pallos, "Gas Turbine Repair Technology," GE Power Systems, GER-3975B, pp. 1-26.

C. Rinaldi, et al, "Epitaxial Repair And In Situ Damage Assessment for Turbine Blades," Journal of Power and Energy, Mar. 1, 2005, pp. 93-99, vol. 219, Issue 2.

* cited by examiner

THERMAL BARRIER COATING REPAIR COMPOSITIONS AND METHODS OF USE THEREOF

FIELD OF THE INVENTION

The present invention is directed to repair compositions for repairing damaged areas of thermal barrier coatings and methods of use thereof.

BACKGROUND OF THE INVENTION

Higher operating temperatures of gas turbine engines are continually being sought in order to increase the efficiency of the engines. However, as operating temperatures increase, the high temperature durability of the components of the engine must correspondingly increase. Significant advances in high temperature capabilities have been achieved through the formulation of nickel, cobalt and iron based superalloys. These superalloys can be designed to withstand temperatures in the range of about 1000 to about 1100° C. or higher. Nonetheless, when used to form components of the turbine, such as combustor liners, augmentor hardware, shrouds and high and low-pressure nozzles and blades, the superalloys alone could be susceptible to damage by oxidation and hot corrosion attack. Accordingly, these components are typically protected by an environmental and/or a thermal barrier coating (TBC). In general, TBCs can be used in conjunction with the superalloys in order to reduce the cooling air requirements associated with a given turbine. Ceramic materials, such as yttrium-stabilized zirconia (YSZ), are widely used as a TBC or topcoat of TBC systems. These materials are employed because, for example, they can be readily deposited by plasma-spraying and physical vapor deposition (PVD) techniques, and they also generally exhibit desirable thermal characteristics. In general, these TBCs can be utilized in conjunction with the superalloys in order to reduce the cooling air requirements associated with a given turbine.

In order to be effective, TBCs need to possess low thermal conductivity, strongly adhere to the component and remain adhered through many heating and cooling cycles. The latter requirement is particularly demanding due to the different coefficients of thermal expansion between the ceramic materials and the superalloy substrates that they protect. To promote adhesion and extend the service life of a TBC, an oxidation-resistant bond coating typically takes the form of a diffusion aluminide coating or an overlay coating, such as MCrAlX where M is iron, cobalt and/or nickel and X is yttrium or another rare earth element. During the deposition of a ceramic TBC and subsequent exposures to high temperatures, such as during engine operation, these bond coats form a tightly adherent alumina ($Al_2O_3$) layer or scale that adheres the TBC to the bond coat.

The service life of a TBC is typically limited by a spallation event brought on by, for example, thermal fatigue. Accordingly, a significant challenge has been to obtain a more adherent ceramic layer that is less susceptible to spalling when subjected to thermal cycling. Though significant advances have been made, there is the inevitable requirement to repair components whose thermal barrier coatings have spalled. Though spallation typically occurs in localized regions or patches, a conventional repair method has been to completely remove the TBC after removing the affected component from the turbine or other area, restore or repair the bond coat as necessary and recoat the engine component. Techniques for removing TBCs include grit blasting or chemically stripping with an alkaline solution at high temperatures and pressures. However, grit blasting is a slow, labor-intensive process and can erode the surface beneath the coating. The use of an alkaline solution to remove a TBC also is less than ideal because the process typically requires the use of an autoclave operating at high temperatures and pressures. Consequently, some conventional repair methods are labor intensive and expensive, and can be difficult to perform on components with complex geometries, such as airfoils and shrouds. As an alternative, U.S. Pat. No. 5,723,078 to Nagaraj et al. teach selectively repairing a spalled region of a TBC by texturing the exposed surface of the bond coat, and then depositing a ceramic material on the textured surface by plasma spraying. While avoiding the necessity to strip the entire TBC from a component, the repair method taught by Nagaraj et al. requires removal of the component in order to deposit the ceramic material.

In the case of large power generation turbines, completely halting power generation for an extended period of time in order to remove components whose TBCs have suffered only localized spallation is not economically desirable.

U.S. Pat. No. 7,476,703 to Ruud et al. discloses an in-situ method and composition for repairing a thermal barrier coating, which is based on a silicone resin system. While this in-situ method alleviates the disassembly, masking and over-spraying problems associated with some conventional TBC repair methods, it is not an ideal repair for large area defects (i.e., defects that are greater than 1 square inch in size). U.S. Pat. No. 6,413,578 to Stowell et al. discloses an in-situ method for repairing thermal barrier coating with a ceramic paste. However, this method uses a repair composition that contains ethyl alcohol. As a result, flammable ethyl alcohol fumes are released when the repair composition is used, which creates environmental health and safety risks.

A commercially available repair composition, AIM-MRO SR Resin Patch, may be used for TBC repair. However, this repair composition is silicate based and for this reason does not offer the desired performance of thermal barrier coating. Additionally, the commercial repair composition cannot be used to repair large area defects, such as when the damaged area is greater than 1 square inch in size.

Accordingly, despite the above advances, it would be desirable if a repair method and a repair composition were available that could be performed on damaged regions of various sizes, including large damaged regions (i.e., damaged regions that are greater than 1 square inch in size), without necessitating that the component be removed from the turbine, so that downtime and scrappage are minimized. Such damaged regions may be created by localized spallation, damage caused by tool hits, and/or chipping. Furthermore, it would be desirable to have a repair composition that uses water as a liquid carrier, thus avoiding environmental health and safety risks associated with repair compositions that use organic solvents, such as ethyl alcohol.

SUMMARY OF THE INVENTION

The present invention relates to repair compositions for thermal barrier coating and methods of use of the disclosed repair compositions. Thus, in one embodiment, the invention is directed to a repair composition which includes: a ceramic composition in an amount of from about 40 to about 60 percent by volume of the repair composition; a colloidal solution in an amount of from about 15 to about 25 percent by volume of the repair composition; an aqueous binder in an amount of from about 5 to about 15 percent by volume of the repair composition; an aqueous dispersant in an amount of from about 4 to about 8 percent by volume of the repair composition; and an aqueous ammonia solution in an amount of from about 5 to about 15 percent, for example, 9 percent, by volume of the repair composition.

The ceramic composition includes: a first population of yttria-stabilized zirconia particles having a mean diameter from about 250 nm to about 1000 nm, in an amount of from about 15 to about 30 percent by volume of the ceramic composition; a second population of yttria-stabilized zirconia particles having a mean diameter from about 2 µm to about 10 µm, in an amount of from about 10 to about 25 percent by volume of the ceramic composition; and a third population of yttria-stabilized zirconia particles having a mean diameter from about 20 µm to about 250 µm, in an amount of from about 50 to about 70 percent by volume of the ceramic composition.

The colloidal solution includes: an aqueous solvent in an amount of from about 90 to about 98 percent by volume of the colloidal solution; and a fourth population of yttria-stabilized zirconia particles having a mean diameter from about 2 nm to about 200 nm, in an amount of from about 2 to about 10 percent by volume of the colloidal solution.

In another embodiment, the invention is directed to a method for repairing a thermal barrier coating, wherein the thermal barrier coating is located on a component and wherein the thermal barrier coating has a damaged region, the method including: depositing a repair layer onto the damaged region, the repair layer including the disclosed herein repair composition; and heat treating the repair layer at a temperature of from about 900° C. to about 1400° C., to thereby form a patch.

In another embodiment, the invention is directed to a method for repairing a thermal barrier coating, wherein the thermal barrier coating is located on a component and wherein the thermal barrier coating has a damaged region, the method including: depositing an initial layer onto the damaged area, the initial layer including the described herein repair composition; heat treating the initial layer at a temperature of from about 250° C. to about 600° C.; optionally, repeating one or more times a combination of the steps of depositing the initial layer onto the damaged area and heat treating the initial layer at a temperature of from about 250° C. to about 600° C., to thereby form a plurality of initial layers; depositing a final layer onto the initial layer or onto the plurality of initial layers, the final layer including the disclosed herein repair composition; and concurrently heat treating the final layer and the initial layer at a temperature of from about 900° C. to about 1400° C., to thereby form a patch; or concurrently heat treating the final layer and the plurality of initial layers at a temperature of from about 900° C. to about 1400° C., to thereby form the patch.

The disclosed herein repair compositions and methods have numerous advantages. The disclosed repair composition and methods could be used to repair damaged regions of various sizes, including large damaged regions that are greater than 1 square inch in size. Our repair compositions use water as a liquid carrier, thus avoiding environmental health and safety risks associated with repair compositions that use organic solvents, such as ethyl alcohol.

Furthermore, the disclosed repair compositions are a thixotropic (i.e., shear thinning) slurry system, which enables one to use the disclosed repair compositions to deposit a near net shape patch. The disclosed herein repair compositions retain near net shape through our unique design of particle distribution, optimization of solids loading, and sol (i.e., colloidal solution) chemistry.

Moreover, the methods disclosed herein are advantageous because they can be performed in situ, without dismantling or removing components that need to be repaired. The repaired TBC can then be sintered at temperatures lower than engine operating temperature without any dimensional instability. Not having to dismantle and remove components for stripping and recoating makes our disclosed herein methods less laborious, very cost effective, and affording a drastic reduction in the down time of an engine. Additionally, our methods do not require any additional sintering cycles to sinter the repair composition before it undergoes service cycles.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

In the following specification and the claims which follow, reference will be made to a number of terms, which shall be defined to have the following meanings.

The singular forms "a", "an", and "the" include plural referents unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", is not to be limited to the precise value specified. In some instances, the approximating language may correspond to the precision of an instrument for measuring the value.

As used herein, the term "colloidal solution" refers to a solution in which particles are evenly suspended in a liquid. These particles are sufficiently fine in size so that the suspension is stable and there is no sedimentation of particles from the suspension.

As used herein, the term "yttria-stabilized zirconia" refers to a ceramic in which the crystal structure of zirconium dioxide, i.e., "zirconia" ($ZrO_2$), has an addition of yttrium oxide, i.e., "yttria" ($Y_2O_3$).

As used herein, the term "thermal barrier coating" is known in the art and refers to materials systems usually applied to metallic surfaces, such as on gas turbine or aero-engine parts, operating at elevated temperatures, as a form of exhaust heat management.

As used herein, the term "mil" refers to unit of measurement equal to a thousandth of an inch, i.e., 0.001 inches or 25.40 µm. A plural form of "mil" is "mils".

A mean diameter of particles (i.e., d50) may be measured by laser diffraction technique in a MASTERSIZER 3000™ laser diffraction particle size analyzer manufactured by Malvern Instrument Ltd.

In one embodiment, the invention is directed to a repair composition which includes: a ceramic composition in an amount of from about 40 to about 60 percent by volume of the repair composition; a colloidal solution in an amount of from about 15 to about 25 percent by volume of the repair composition; an aqueous binder in an amount of from about 5 to about 15 percent by volume of the repair composition; an aqueous dispersant in an amount of from about 4 to about 8 percent by volume of the repair composition; and an aqueous ammonia solution in an amount of from about 5 to about 10 percent by volume of the repair composition.

In one embodiment, the ceramic composition is in an amount of from about 45 to about 55 percent by volume of the repair composition. In one embodiment, the colloidal solution is in an amount of from about 18 to about 22 percent by volume of the repair composition. In one embodiment, the aqueous binder is in an amount of from about 10 to about 15 percent by volume of the repair composition. In one embodiment, the aqueous dispersant is in an amount of from about 6 to about 8 percent by volume of the repair composition. In one embodiment, the aqueous ammonia solution is in an amount of from about 8 to about 10 percent by volume of the repair composition.

The ceramic composition includes: a first population of yttria-stabilized zirconia particles having a mean diameter from about 250 nm to about 1000 nm (i.e., fine particles population), in an amount of from about 15 to about 30 percent by volume of the ceramic composition; a second population of yttria-stabilized zirconia particles having a mean diameter from about 2 µm to about 10 µm (i.e., medium particles population), in an amount of from about 10 to about 25 percent by volume of the ceramic composition; and a third population of yttria-stabilized zirconia particles having a mean diameter from about 20 µm to about 250 µm (i.e., coarse particles population), in an amount of from about 50 to about 70 percent by volume of the ceramic composition.

In one embodiment, the first population of yttria-stabilized zirconia particles is in an amount of from about 22 to about 28 percent by volume of the ceramic composition. In one embodiment, the second population of yttria-stabilized zirconia particles is in an amount of from about 15 to about 20 percent by volume of the ceramic composition. In one embodiment, the third population of yttria-stabilized zirconia particles is in an amount of from about 55 to about 65 percent by volume of the ceramic composition. The approximating term "about" refers to the precision of an instrument for measuring the value.

The ceramic composition includes a mixture of various particle size classes, including a coarse size class (i.e., third population of yttria-stabilized zirconia particles), a medium size class (i.e., second population of yttria-stabilized zirconia particles), and a fine size class (i.e., first population of yttria-stabilized zirconia particles). The absolute size and relative proportions of the particles selected for each class depend in large part on the desired final thickness of the coating being repaired. For example, the coarse size class (that is, the largest particle class used in the ceramic composition) is selected to build coating volume to the desired thickness, and as such can be thought of as being used as a scaffold for the repaired coating. The medium size class, then, is selected to fill in the bulk of the interstitial space between particles of the coarse size class; the other particle size classes are similarly selected to fill in remaining interstitial space. By carefully selecting the size and relative proportions of the various size classes, a coating of a desired thickness can be fabricated with much higher density than can be achieved by building a coating from a single size class.

The coarse size class, then, is selected based in large part on the desired thickness of the resultant coating, and in some embodiments has a median particle size in the range from about 20 µm to about 250 µm. In applications where comparatively thin coatings are used, the median particle size range for the coarse size class may be smaller, such as from about 20 µm to about 50 µm. In applications where comparatively thick coatings are used, the median particle size range for the coarse size class may be larger, such as from about 30 µm to about 250 µm. Typically, the coarse size class particles make up from about 50 percent to about 70 percent of the volume of the ceramic composition.

The smaller size classes are then selected to reinforce the scaffold created by the coarse size class as noted above. In some embodiments, the medium size class has a median particle size in the range from about 2 µm to about 10 µm. In applications employing comparatively thin coatings, the median particle size range may be smaller, such as from about 2 µm to about 6 µm. In applications employing comparatively thicker coatings, the median particle size range may be larger, such as from about 5 µm to about 10 µm. Typically, the medium size class particles make up from about 10 percent to about 25 percent of the volume of the ceramic composition. In some embodiments, the fine size class has a median particle size in the range from about 250 nm to about 1 µm. In some embodiments, depending on the size of the voids intended to be filled by the fine particle size class, the median particle size of the fine size class is in a range from about 500 nm to about 1 µm. Typically, the fine size class particles make up from about 15 percent to about 30 percent of the volume of the ceramic composition.

A commercially available suitable first population of yttria-stabilized zirconia particles (fine particles) is available under the name TOSOH-4Y from TOSOH USA Inc. A commercially available suitable second population of yttria-stabilized zirconia particles (medium particles) is available under the name Imerys 8YSZ-HP 5 µm from Imerys Fused Minerals. A commercially available suitable third population of yttria-stabilized zirconia particles (large particles) is available under the name Amperit 825 from HC Stark GmBH.

The colloidal solution includes: an aqueous solvent in an amount of from about 90 to about 98 percent by volume of the colloidal solution; and a fourth population of yttria-stabilized zirconia particles having particles with a mean diameter from about 2 nm to about 200 nm (i.e., very fine particles population), in an amount of from about 2 to about 10 percent by volume of the colloidal solution.

In one embodiment, the aqueous solvent of the colloidal solution is in an amount of from about 92 to about 98 percent by volume of the colloidal solution and the fourth population of yttria-stabilized zirconia particles is in an amount of from about 2 to about 8 percent by volume of the colloidal solution. A commercially available suitable colloidal solution is available under the name ZRYS4 from Nyacol Nano Technologies.

In one embodiment, the repair composition does not include silicone, silica, or silicate. In one embodiment of the repair composition, the first population of yttria-stabilized zirconia particles, the second population of yttria-stabilized zirconia particles, the third population of yttria-stabilized zirconia particles, and the fourth population of yttria-stabilized zirconia particles have from about 4 to about 60 mole percent yttrium oxide content. In another embodiment, the first, the second, the third, and the fourth populations of yttria-stabilized zirconia particles have from about 4 to about 20 mole percent yttrium oxide content. In another embodiment, the first, the second, the third, and the fourth populations of yttria-stabilized zirconia particles have 8 mole percent yttrium oxide content.

In one embodiment, the aqueous binder includes water and a binder selected from the group which includes water and poly(alkylene carbonate) copolymer, cellulose binder, poly(vinyl alcohol), and polyethylene glycol. For example, poly(propylene carbonate), a binder for ceramic powders, is commercially available under a trade name of QPAC®40. In one embodiment, the aqueous dispersant includes ammonium polyacrylate and water. Examples of commercially available ammonium polyacrylate dispersing agents for ceramic bodies are DARVAN® 821-A, DARVAN® 825, and Darvan C.

In one embodiment, the aqueous ammonia solution includes ammonia and water, wherein the ammonia is in an amount of from about 25 to about 50 percent by volume of the aqueous ammonia solution. In another embodiment, the aqueous ammonia solution includes ammonia and water, wherein the ammonia is in an amount of from about 40 to about 50 percent by volume of the aqueous ammonia solution. In one embodiment the ammonia is in an amount of about 30 percent by volume of the aqueous ammonia solution.

The aqueous ammonia solution serves several roles in the repair composition. The aqueous ammonia solution is a rheology modifier, it is responsible for the thixotropic nature of the repair composition. The aqueous ammonia solution also increases the pH to the 9-11 range keeping the repair composition stable. We also believe that the aqueous ammonia solution acts as a gelling agent thereby increasing the green strength of the repaired area at room temperature. The aqueous ammonia solution evaporates after the repairing is completed. Upon evaporation the rheology increases and sets the repair composition just like an epoxy.

Figure 1:
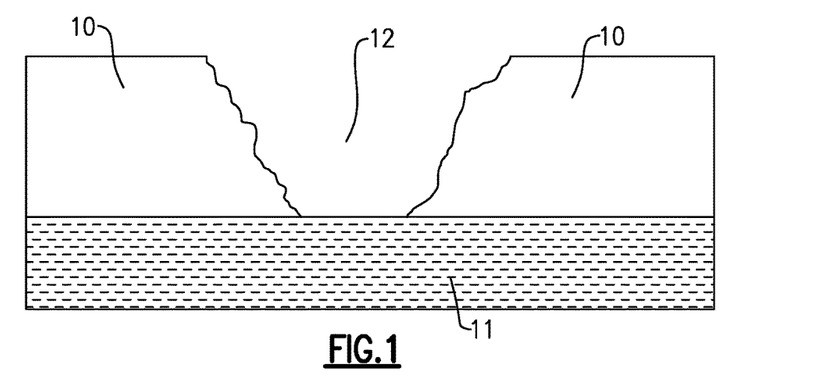
FIG. 1 provides an idealized cross-sectional view of the thermal barrier coating, the component, and the damaged region.
Figure 2:
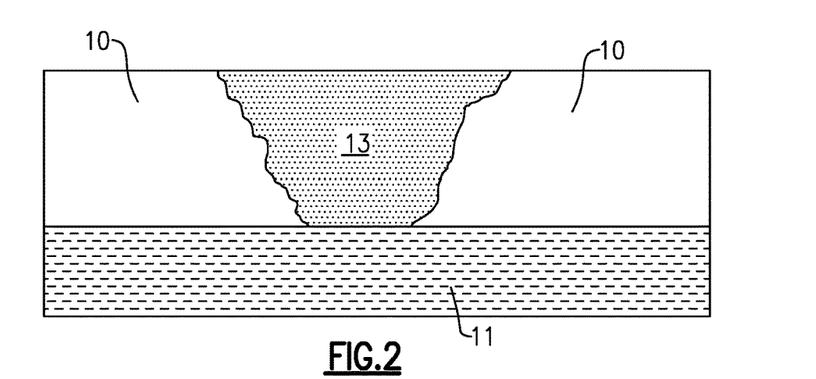
FIG. 2 provides an idealized cross-sectional view of the thermal barrier coating, the component, and the repair layer.

The present invention is also directed to a method for repairing a thermal barrier coating, wherein the thermal barrier coating is located on a component and wherein the thermal barrier coating has a damaged region, the method including: depositing a repair layer onto the damaged region, the repair layer including the described herein repair composition; and heat treating the repair layer at a temperature of from about 900° C. to about 1400° C., to thereby form a patch. The damaged region may be, for example, spallation, a chip, or a large damaged area. The large damaged areas may be as large as 3 inches by 3 inches. In one embodiment, the heat treating temperature may be from about 1000° C. to about 1200° C. The heat treating step, or sintering, removes moisture and organic content from the repair composition and it also forms a ceramic body with the desired insulating properties. The heat treating may be localized to the repair layer or entire part may be heat treated. Localized heat treating may be performed with a torch, by induction, resistive heating or other methods known in the art. When the entire part is heat treated, the repair can be made while the engine is assembled by simply running the engine to perform the heat treating step. In one embodiment, the repair layer includes only the repair composition. FIG. 1 provides an idealized cross-sectional view of the thermal barrier coating 10, the component 11, and the damaged region 12. FIG. 2 provides an idealized cross-sectional view of the thermal barrier coating 10, the component 11, and the repair layer 13.

In one embodiment, the method for repairing a thermal barrier coating further includes, subsequent to the depositing of the repair layer and prior to heat treating the repair layer, drying the repair layer at a temperature of from about 50° C. to about 120° C. In one embodiment, the drying temperature may be from about 100° C. to about 110° C. In another embodiment, the method for repairing a thermal barrier coating further includes drying of the repair layer during a warm up to the heat treating temperature.

In one embodiment, the depositing of the repair layer onto the damaged region is performed manually. In another embodiment, the depositing of the repair layer onto the damaged region is performed with an apparatus designed for such purpose.

In one embodiment, the thermal barrier coating is formed by a plasma spray process. In another embodiment, the thermal barrier coating is formed by an electron beam physical vapor deposition process.

In one embodiment, the thermal barrier coating has a thickness, i.e., depth, of from about 5 mils to about 25 mils. In one embodiment, the repair layer has a thickness of from about 5 mils to about 25 mils. In one embodiment, the repair layer has substantially the same thickness as a thickness of the thermal barrier coating. The term "substantially the same thickness" as used herein refers to thickness measurements that are equal or within the range of about ±0.5 mils of each other.

In one embodiment, the component is disposed within a gas turbine engine.

In one embodiment of the method for repairing a thermal barrier coating, yttrium oxide content of the first, the second, the third, and the fourth populations of yttria-stabilized zirconia particles is the same as yttrium oxide content of the thermal barrier coating being repaired.

In one embodiment of the method for repairing a thermal barrier coating, the thermal barrier coating has a yttrium oxide content of from about 4 mole percent to about 10 mole percent, wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±1 mole percent of the yttrium oxide content of the thermal barrier coating.

In another embodiment of the method for repairing a thermal barrier coating, the thermal barrier coating has a yttrium oxide content of from about 10 mole percent to about 20 mole percent, wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±2 mole percent of the yttrium oxide content of the thermal barrier coating.

In another embodiment of the method for repairing a thermal barrier coating, the thermal barrier coating has a yttrium oxide content of from about 20 mole percent to about 60 mole percent, wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±5 mole percent of the yttrium oxide content of the thermal barrier coating.

Figure 3:
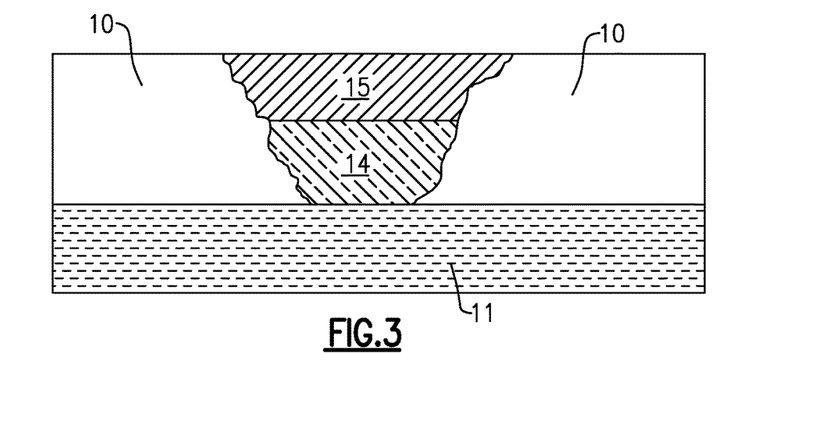
FIG. 3 provides an idealized cross-sectional view of the thermal barrier coating, the component, the initial layer, and the final layer.

In another embodiment, the invention is directed to a method for repairing a thermal barrier coating, wherein the thermal barrier coating is located on a component and wherein the thermal barrier coating has a damaged region, the method including: depositing an initial layer onto the damaged area, the initial layer including the described herein repair composition; heat treating the initial layer at a temperature of from about 250° C. to about 600° C.; optionally, repeating one or more times a combination of the steps of depositing the initial layer onto the damaged area and heat treating the initial layer at a temperature of from about 250° C. to about 600° C., to thereby form a plurality of initial layers; depositing a final layer onto the initial layer or onto the plurality of initial layers, the final layer comprising the repair composition; and concurrently heat treating the final layer and the initial layer at a temperature of from about 900° C. to about 1400° C., to thereby form a patch, or concurrently heat treating the final layer and the plurality of initial layers at a temperature of from about 900° C. to about 1400° C., to thereby form the patch. The heat treating steps may be performed as described above. In one embodiment, the repair layer and the final layer include only the repair composition. FIG. 3 provides an idealized cross-sectional view of the thermal barrier coating 10, the component 11, the initial layer 14, and the final layer 15.

In one embodiment, the heat treating of the initial layer temperature may be from about 300° C. to about 500° C. In one embodiment, the temperature of concurrently heat treating the final layer and the initial layer may be from about 1000° C. to about 1200° C. In one embodiment, the temperature of concurrently heat treating the final layer and the plurality of initial layers may be from about 1000° C. to about 1200° C.

In one embodiment, the method further includes, subsequent to the depositing of the initial layer and prior to heat treating the initial layer, drying the initial layer at a temperature of from about 50° C. to about 120° C. In one embodiment, the drying temperature may be from about 100° C. to about 110° C. In one embodiment, the method further includes drying of the initial layer during a warm up to the temperature of the heat treating of the initial layer.

In one embodiment, the method further includes, subsequent to deposition the final layer and prior to concurrently heat treating the final layer and the initial layer, drying the final layer at a temperature of from about 50° C. to about 120° C., or subsequent to deposition of the final layer and prior to concurrently heat treating the final layer and the plurality of initial layers, drying the final layer at a temperature of from about 50° C. to about 120° C. In one embodiment, the drying temperature may be from about 100° C. to about 110° C.

In one embodiment, the method further includes, subsequent to deposition the final layer and prior to concurrently heat treating the final layer and the initial layer, drying the final layer during a warm up to the temperature of the concurrent heat treating of the final layer and initial layer, or subsequent to deposition the final layer and prior to concurrently heat treating the final layer and the plurality of initial layers, drying the final layer during a warm up to the temperature of the concurrent heat treating of the final layer and the plurality of initial layers.

In one embodiment, the thermal barrier coating is formed by a plasma spray process. In another embodiment, the thermal barrier coating is formed by an electron beam physical vapor deposition process.

In one embodiment, the depositing of the initial layer and the final layer is performed manually.

In one embodiment, the thermal barrier coating has a thickness of from about 5 mils to about 95 mils. In one embodiment, the initial layer has a thickness of from about 5 mils to about 25 mils. In one embodiment, the final layer has a thickness of from about 5 mils to about 25 mils. In one embodiment, the plurality of initial layers comprises from 2 to 4 initial layers. In one embodiment, a combination of the initial layer and the final layer has substantially the same thickness as a thickness of the thermal barrier coating. In another embodiment, a combination of the plurality of initial layers and the final layer has substantially the same thickness as a thickness of the thermal barrier coating. The term "substantially the same thickness" as used herein refers to thickness measurements that are equal or within the range of about ±0.5 mils of each other.

In one embodiment, the component is disposed within a gas turbine engine.

In one embodiment, the first population of yttria-stabilized zirconia particles, the second population of yttria-stabilized zirconia particles, the third population of yttria-stabilized zirconia particles, and the fourth population of yttria-stabilized zirconia particles have from about 4 to about 60 mole percent yttrium oxide content. In another embodiment, the first, the second, the third, and the fourth populations of yttria-stabilized zirconia particles have from about 4 to about 20 mole percent yttrium oxide content.

In one embodiment of the method for repairing a thermal barrier coating, yttrium oxide content of the first, the second, the third, and the fourth populations of yttria-stabilized zirconia particles is the same as yttrium oxide content of the thermal barrier coating being repaired.

In one embodiment of the method for repairing a thermal barrier coating, the thermal barrier coating has a yttrium oxide content of from about 4 mole percent to about 10 mole percent, wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±1 mole percent of the yttrium oxide content of the thermal barrier coating.

In another embodiment of the method for repairing a thermal barrier coating, the thermal barrier coating has a yttrium oxide content of from about 10 mole percent to about 20 mole percent, wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±2 mole percent of the yttrium oxide content of the thermal barrier coating.

In another embodiment of the method for repairing a thermal barrier coating, the thermal barrier coating has a yttrium oxide content of from about 20 mole percent to about 60 mole percent, wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±5 mole percent of the yttrium oxide content of the thermal barrier coating.

This written description uses examples to disclose embodiments of the invention, including the best mode, and also to enable any person skilled in the art to practice the invention, including making and using any devices or systems and performing any incorporated methods. The patentable scope of the invention is not limited to the scope of the provided examples, and may include other examples that occur to those skilled in the art. Such other examples are intended to be within the scope of the claims if they have structural elements or method steps that do not differ from the literal language of the claims, or if they include equivalent structural elements or method steps with insubstantial differences from the literal language of the claims.

EXAMPLES

Example 1

Repair Composition

The following Table 1 represents one example of a repair composition of the invention.

TABLE 1

Repair composition example.

| Material | Vol % |
|---|---|
| Fine particles of the ceramic composition (first population of yttria-stablized zirconia particles, d50 = 800 nm ± 100 nm, 4 mol % YSZ) | 15 |
| Medium particles of the ceramic composition (second population of yttria-stablized zirconia particles, d50 = 4 µm ± 1 µm, 4 mol % YSZ) | 10 |
| Large particles of the ceramic composition (third population of yttria-stablized zirconia particles, d50 = 25 µm ± 3 µm, 4 mol % YSZ) | 30 |
| NYACOL ® ZRYS4 (colloidal solution with fourth population of yttria-stabilized zirconia particle, d50 = 100 nm ± 50 nm, 1.32 wt % YSZ) | 20 |
| QPAC ® 40 Poly(propylene carbonate) (aqueous binder) | 10 |
| DARVAN ® 825 (aqueous dispersant) | 6 |
| Aqueous ammonia (30% volume concentration of ammonia) | 9 |

Example 2

Preparation of Repair Composition

To prepare the repair composition of Example 1, first, three different powders (Fine particles, (18.5 gm) Medium particles, (12 gm) and Large particles (41 gm)) were weighed, put in a NALGENE™ bell mouth bottle, and mixed using THINKY® planetary mixer at 1500 rpm for 3 min. This step was followed by a visual inspection to ensure homogenous distribution of large, medium and fine particles in the dry powder. The container was then opened, and visually inspected by rolling around to ensure uniform colorization of powders, indicating that the mix is well distributed. Next, 3 ml of QPAC® 40 (aqueous binder), 1.5 ml of DARVAN® 825 (aqueous dispersant), 5 ml of NYACOL® ZRYS4 (colloidal solution with fourth population of yttria-stabilized zirconia particles, d50=100 nm), and 2 ml of ammonia aqueous solution of 30% vol ammonia were added to the powders and mixed using THINKY® planetary mixer at 1500 rpm for 3 min. Mixing step was repeated in order to ensure slurry homogeneity without any agglomerates.

Example 3

Method of Repairing a Thermal Barrier Coating (TBC)

A piece measuring 4×4 inches was cut from a field returned combustor liner. The field returned combustor liner had 4 mole percent yttrium oxide content. From this section, 1 inch diameter round 6 samples were cut. A simulated 0.75 inch circular defect was created on each sample by grit blasting for 6-10 seconds with abrasive 60 grit alumina particles at 60 psi with standoff distance of 4 inches to simulate damage from operation of a turbine. The grit blasted field returned liner was cleaned first with acetone and later in isopropanol using ultrasonic bath for 20 minutes. The damaged region was cleaned in order to remove any TBC debris. After cleaning, the damaged TBC part was dried at room temperature and then the repair composition of Example 1 was deposited on the damaged region using a steel spatula, thus forming a repair layer. The top surface of the repair layer was leveled with the remnant TBC using doctor blade. Subsequently, the repair layer was first dried at room temperature for 2 hours and then at 100° C. for 4 hours. The repair layer was then sintered at 1000° C. for 6 hour in air, thereby forming a patch on the TBC part.

As discussed below, the repaired samples from Example 3 were tested in two different modes to simulate the thermal conditions in an engine. The first is called furnace cycle test (FCT) and the second is called the jet engine thermal shock (JETS) test. FCT tests were conducted isothermally in a bottom-loaded rapid heating furnace. JETS tests were conducted using a natural gas/oxygen mixture gas torch where the heat input was controlled to obtain a thermal gradient across the sample thickness. As discussed below, samples from Example 3 were also tested for adhesion using an ASTM standard to understand how the repaired coating has adhered to the bond coat.

Example 4

Furnace Cycle Testing (FCT)

50 specimens were subjected to cyclic thermal exposure in a furnace cycle test (FCT) after repairing samples as described in Example 3 using the repair composition described in Example 1. During a 1 hour cycle, the specimens were inserted rapidly into a bottom-loading furnace and held at 1135° C. for 45 min. The specimens were then withdrawn from the furnace and forced-air cooled for 15 min before beginning the next cycle. Specimens were removed from the FCT and examined after 20 cycles. The samples remained in the test until spallation of 20% of the coating area to determine the FCT life. Out of 50 samples tested, the median life was 220 cycles.

Example 5

Tensile Pull Adhesion Testing

After repairing samples as described in Example 3 using the repair composition described in Example 1, tensile adhesion strength was measured on 20 repaired samples following the Standard Test Method for Adhesion or Cohesion Strength of Flame-Sprayed Coatings as per ASTM standard C633-79. Right circular cylindrical fixtures (2.54 cm height and 1.91 cm diameter) were attached to the surfaces of the TBC and the substrate using an adhesive Cytec FM1000. A tensile load was applied at a constant displacement rate of 0.017 mm/s until the coating delaminated from the substrate. The tensile adhesion strength was determined from the area and the maximum load at failure. Out of 20 samples tested, the median adhesion strength was 1185 psi.

Example 6

Jet Engine Thermal Shock (JETS) Testing

After repairing samples as described in Example 3 using the repair composition described in Example 1, JETS tests were performed. The JETS test creates a thermal gradient equivalent to a jet engine across the TBC. TBC front surface temperature was 1235° C. (2250 F). An oxygen-natural gas torch heated a 2.54 inch diameter in 8 repaired samples, which were attached to a carousel. A stepping motor advanced the buttons (i.e., repaired samples) through the positions. Under our testing protocol, the repaired samples remained in the test either until 2000 cycles were completed or until spallation of 20% of the coated area. All eight samples were tested at these conditions. All of the tested repaired samples withstood 2000 cycles and none of the tested repaired samples spalled.

While only certain features of the invention have been illustrated and described herein, many modifications and changes will occur to those skilled in the art. It is, therefore, to be understood that the appended claims are intended to cover all such modifications and changes as falling within the true spirit of the invention.

Throughout this application, various references are referred to. The disclosures of these publications in their entireties are hereby incorporated by reference as if written herein.

What is claimed is:

1. A method for repairing a thermal barrier coating, wherein the thermal barrier coating is located on a component and wherein the thermal barrier coating has a damaged region, the method comprising:
    depositing a repair layer onto the damaged region, the repair layer comprising the repair composition comprising:
        a ceramic composition in an amount of from about 40 to about 60 percent by volume of the repair composition;
        a colloidal solution in an amount of from about 15 to about 25 percent by volume of the repair composition;
        an aqueous binder in an amount of from about 5 to about 15 percent by volume of the repair composition;
        an aqueous dispersant in an amount of from about 4 to about 8 percent by volume of the repair composition;
        an aqueous ammonia solution in an amount of from about 5 to about 10 percent by volume of the repair composition;
        wherein the ceramic composition comprises:
            a first population of yttria-stabilized zirconia particles having a mean diameter from about 250 nm to about 1000 nm, in an amount of from about 15 to about 30 percent by volume of the ceramic composition;
            a second population of yttria-stabilized zirconia particles having a mean diameter from about 2 μm to about 10 μm, in an amount of from about 10 to about 25 percent by volume of the ceramic composition; and
            a third population of yttria-stabilized zirconia particles having a mean diameter from about 20 μm to about 250 μm, in an amount of from about 50 to about 70 percent by volume of the ceramic composition;
        and wherein the colloidal solution comprises:
            an aqueous solvent in an amount of from about 90 to about 98 percent by volume of the colloidal solution; and
            a fourth population of yttria-stabilized zirconia particles having a mean diameter from about 2 nm to about 200 nm, in an amount of from about 2 to about 10 percent by volume of the colloidal solution; and
    heat treating the repair layer at a temperature of from about 900° C. to about 1400° C., to thereby form a patch, wherein the aqueous binder comprises water and a binder selected from the group consisting of poly (alkylene carbonate) copolymer, cellulose binder, poly (vinyl alcohol), and polyethylene glycol.

2. The method of claim 1, further comprising, subsequent to the depositing of the repair layer and prior to heat treating the repair layer, drying the repair layer at a temperature of from about 50° C. to about 120° C.

3. The method of claim 1, further comprising drying of the repair layer during a warm up to the heat treating temperature.

4. The method of claim 1, wherein the thermal barrier coating is formed by a plasma spray process or by an electron beam physical vapor deposition process.

5. The method of claim 1, wherein the depositing of the repair layer onto the damaged region is performed manually.

6. The method of claim 1, wherein the thermal barrier coating has a thickness of from about 5 mils to about 25 mils.

7. The method of claim 1, wherein the repair layer has a thickness of from about 5 mils to about 25 mils.

8. The method of claim 1, wherein the repair layer has substantially the same thickness as the thermal barrier coating.

9. The method of claim 1, wherein the component is disposed within a gas turbine engine.

10. The method of claim 1, wherein the repair composition does not include silicone, silica, or silicate.

11. The method of claim 1, wherein the first population of yttria-stabilized zirconia particles, the second population of yttria-stabilized zirconia particles, the third population of yttria-stabilized zirconia particles, and the fourth population of yttria-stabilized zirconia particles have from about 4 to about 60 mole percent yttrium oxide content.

12. The method of claim 1, wherein the thermal barrier coating has a yttrium oxide content of from about 4 mole percent to about 10 mole percent, and wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±1 mole percent of the yttrium oxide content of the thermal barrier coating.

13. The method of claim 1, wherein the thermal barrier coating has a yttrium oxide content of from about 10 mole percent to about 20 mole percent, and wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±2 mole percent of the yttrium oxide content of the thermal barrier coating.

14. The method of claim 1, wherein the thermal barrier coating has a yttrium oxide content of from about 20 mole percent to about 60 mole percent, and wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±5 mole percent of the yttrium oxide content of the thermal barrier coating.

15. The method of claim 1, wherein the aqueous dispersant comprises ammonium polyacrylate.

16. The method of claim 1, wherein the aqueous ammonia solution comprises ammonia and water, wherein the ammonia is in an amount of from about 25 to about 50 percent by volume of the aqueous ammonia solution.

17. The method of claim 1, wherein the damaged region is a spallation, a chip or a damaged area having a size of up to about 3 inches by 3 inches.

18. A method for repairing a thermal barrier coating, wherein the thermal barrier coating is located on a component and wherein the thermal barrier coating has a damaged region, the method comprising:
depositing an initial layer onto the damaged region, the initial layer comprising the repair composition comprising:
a ceramic composition in an amount of from about 40 to about 60 percent by volume of the repair composition;
a colloidal solution in an amount of from about 15 to about 25 percent by volume of the repair composition;
an aqueous binder in an amount of from about 5 to about 15 percent by volume of the repair composition;
an aqueous dispersant in an amount of from about 4 to about 8 percent by volume of the repair composition;
an aqueous ammonia solution in an amount of from about 5 to about 10 percent by volume of the repair composition;
wherein the ceramic composition comprises:
a first population of yttria-stabilized zirconia particles having a mean diameter from about 250 nm to about 1000 nm, in an amount of from about 15 to about 30 percent by volume of the ceramic composition;
a second population of yttria-stabilized zirconia particles having a mean diameter from about 2 µm to about 10 µm, in an amount of from about 10 to about 25 percent by volume of the ceramic composition; and
a third population of yttria-stabilized zirconia particles having a mean diameter from about 20 µm to about 250 µm, in an amount of from about 50 to about 70 percent by volume of the ceramic composition;
and wherein the colloidal solution comprises:
an aqueous solvent in an amount of from about 90 to about 98 percent by volume of the colloidal solution; and
a fourth population of yttria-stabilized zirconia particles having a mean diameter from about 2 nm to about 200 nm, in an amount of from about 2 to about 10 percent by volume of the colloidal solution;
heat treating the initial layer at a temperature of from about 250° C. to about 600° C.;
optionally, repeating one or more times a combination of the steps of depositing the initial layer onto the damaged region and heat treating the initial layer at a temperature of from about 250° C. to about 600° C., to thereby form a plurality of initial layers;
depositing a final layer onto the initial layer or onto the plurality of initial layers, the final layer comprising the repair composition; and
concurrently heat treating the final layer and the initial layer at a temperature of from about 900° C. to about 1400° C., to thereby form a patch, or concurrently heat treating the final layer and the plurality of initial layers at a temperature of from about 900° C. to about 1400° C. to thereby form the patch, wherein the aqueous binder comprises water and a binder selected from the group consisting of poly(alkylene carbonate) copolymer, cellulose binder, poly(vinyl alcohol), and polyethylene glycol.

19. The method of claim 18, further comprising, subsequent to the depositing of the initial layer and prior to heat treating the initial layer, drying the initial layer at a temperature of from about 50° C. to about 120° C.

20. The method of claim 18, further comprising drying of the initial layer during a warm up to the temperature of the heat treating of the initial layer.

21. The method of claim 18, further comprising:
subsequent to deposition the final layer and prior to concurrently heat treating the final layer and the initial layer, drying the final layer at a temperature of from about 50° C. to about 120° C., or
subsequent to deposition the final layer and prior to concurrently heat treating the final layer and the plurality of initial layers, drying the final layer at a temperature of from about 50° C. to about 120° C.

22. The method of claim 18, further comprising:
subsequent to deposition the final layer and prior to concurrently heat treating the final layer and the initial layer, drying the final layer during a warm up to the temperature of the concurrent heat treating of the final layer and initial layer, or
subsequent to deposition the final layer and prior to concurrently heat treating the final layer and the plurality of initial layers, drying the final layer during a warm up to the temperature of the concurrent heat treating of the final layer and the plurality of initial layers.

23. The method of claim 18, wherein the thermal barrier coating is formed by a plasma spray process or by an electron beam physical vapor deposition process.

24. The method of claim 18, wherein the depositing of the initial layer onto the damaged region is performed manually.

25. The method of claim 18, wherein the depositing of the final layer onto the initial layer or onto the plurality of initial layers is performed manually.

26. The method of claim 18, wherein the thermal barrier coating has a thickness of from about 5 mils to about 95 mils.

27. The method of claim 18, wherein the initial layer has a thickness of from about 5 mils to about 25 mils.

28. The method of claim 18, wherein the final layer has a thickness of from about 5 mils to about 25 mils.

29. The method of claim 18, wherein the plurality of initial layers comprises from 2 to 4 initial layers.

30. The method of claim 18, wherein a combination of the initial layer and the final layer has substantially the same thickness as the thermal barrier coating.

31. The method of claim 18, wherein a combination of the plurality of initial layers and the final layer has substantially the same thickness as the thermal barrier coating.

32. The method of claim 18, wherein the component is disposed within a gas turbine engine.

33. The method of claim 18, wherein the repair composition does not include silicone, silica, or silicate.

34. The method of claim 18, wherein the first population of yttria-stabilized zirconia particles, the second population of yttria-stabilized zirconia particles, the third population of yttria-stabilized zirconia particles, and the fourth population of yttria-stabilized zirconia particles have from about 4 to about 60 mole percent yttrium oxide content.

35. The method of claim 18, wherein the thermal barrier coating has a yttrium oxide content of from about 4 mole percent to about 10 mole percent, and wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±1 mole percent of the yttrium oxide content of the thermal barrier coating.

36. The method of claim 18, wherein the thermal barrier coating has a yttrium oxide content of from about 10 mole percent to about 20 mole percent, and wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±2 mole percent of the yttrium oxide content of the thermal barrier coating.

37. The method of claim 18, wherein the thermal barrier coating has a yttrium oxide content of from about 20 mole percent to about 60 mole percent, and wherein the first population of yttria-stabilized zirconia particles, the second population of yttria-stabilized zirconia particles, the third population of yttria-stabilized zirconia particles, and the fourth population of yttria-stabilized zirconia particles have a yttrium oxide content that falls in a range of about ±5 mole percent of the yttrium oxide content of the thermal barrier coating.

38. The method of claim 18, wherein the aqueous dispersant comprises ammonium polyacrylate.

39. The method of claim 18, wherein the aqueous ammonia solution comprises ammonia and water, wherein the ammonia is in an amount of from about 25 to about 50 percent by volume of the aqueous ammonia solution.

40. The method of claim 18, wherein the damaged region is a spallation, a chip or a damaged area having a size of up to about 3 inches by 3 inches.

\* \* \* \* \*